(12) United States Patent
Thorne

(10) Patent No.: US 10,908,308 B1
(45) Date of Patent: Feb. 2, 2021

(54) SYSTEM AND METHOD FOR BUILDING RESERVOIR PROPERTY MODELS

(71) Applicant: Chevron U.S.A. Inc., San Ramon, CA (US)

(72) Inventor: Julian A. Thorne, Houston, TX (US)

(73) Assignee: Chevron U.S.A. Inc., San Ramon, CA (US)

( * ) Notice: Subject to any disclaimer, the term of this patent is extended or adjusted under 35 U.S.C. 154(b) by 0 days.

(21) Appl. No.: 16/522,445

(22) Filed: Jul. 25, 2019

(51) Int. Cl.
| | |
|---|---|
| *G01V 1/30* | (2006.01) |
| *G01V 1/34* | (2006.01) |
| *G06F 17/15* | (2006.01) |
| *G01V 99/00* | (2009.01) |
| *G01V 3/34* | (2006.01) |
| *G06F 30/20* | (2020.01) |

(52) U.S. Cl.
CPC .............. *G01V 1/301* (2013.01); *G01V 1/306* (2013.01); *G01V 1/345* (2013.01); *G01V 3/34* (2013.01); *G01V 99/005* (2013.01); *G06F 17/15* (2013.01); *G06F 30/20* (2020.01)

(58) Field of Classification Search
None
See application file for complete search history.

(56) References Cited

U.S. PATENT DOCUMENTS 8,447,524 B2 * 5/2013 Chen ..................... G01V 1/345
702/16

OTHER PUBLICATIONS

Wicker et al. "Optimization of Horizontal Wells Utilizing Multi-Variate Analyics of Seismic Inversion in Wolfcamp Formation of the Midland Basin", AAPG 2017 Annual Convention and Exhibition, Houston, Texas, Apr. 2-5, 2017 (Year: 2017).*
Yenwongfai et al. "Prestack Simultaneous Inversion to Predict Lithology and Pore Fluid in the Realgrunnen Subgroup of the Goliat Field, Southwester Barents Sea", 2017, 78th EAGE Conference and Exhibition in Vienna, Jun. 2016 (Year: 2016).*
Doktor et al. "Introducing Geo-statistical Methods for Time-Geographical Modelling", 2004, Dept. of Environmental Science and Technology, Imperial College. (Year: 2004).*
Vo et al. "Regularized kernel PCA for the Efficient Parameterization of Complex Geological Models", 2016, Journal of Computational Physics 322 (2016), 859-881. (Year: 2016).*

(Continued)

*Primary Examiner* — Roy Y Yi
(74) *Attorney, Agent, or Firm* — Marie L. Clapp

(57) ABSTRACT

A method is described for generating a reservoir property model based on the quality of a seismic inversion product. The method may include receiving a seismic inversion product volume, a seismic attribute volume, and well data from wells drilled in a subsurface volume of interest; identifying collocated cells in the seismic volumes which correspond to the well data; creating attribute vectors from the seismic volumes in each of the collocated cells and a range of neighboring cells; calculating a seismic inversion error magnitude property at the collocated cells; training a data analytics method to predict the observed seismic inversion error magnitude property; verifying that the data analytics method accurately predicts the seismic inversion error magnitude using cross-validation; generating an inversion quality volume; and generating the reservoir property model based on the inversion quality volume. The method may be executed by a computer system.

8 Claims, 4 Drawing Sheets

One Map-view Slice of predicted inversion quality.

(56) References Cited

OTHER PUBLICATIONS

Tracy J. Stark, "Relative geologic time (age) volumes—Relating every seismic sample to a geologically reasonable horizon", The Leading Edge, Sep. 2004, pp. 928-932.
J.R. Scheevel et al., "Principal Component Analysis Applied to 3D Seismic Data for Reservoir Property Estimation", Society of Petroleum Engineers, SPE 56734, presented at the 1999 SPE Annual Technical Conference and Exhibition held in Houston, Texas, Oct. 3-6, 1999.

* cited by examiner

SYSTEM AND METHOD FOR BUILDING RESERVOIR PROPERTY MODELS

CROSS-REFERENCE TO RELATED APPLICATIONS

Not applicable.

STATEMENT REGARDING FEDERALLY SPONSORED RESEARCH OR DEVELOPMENT

Not applicable.

TECHNICAL FIELD

The disclosed embodiments relate generally to techniques for managing hydrocarbon production from subsurface reservoirs and, in particular, to a method of analyzing seismic inversion property volumes to determine inversion quality and build a reservoir property model to be used to optimize hydrocarbon production.

BACKGROUND

Seismic exploration involves surveying subterranean geological media for hydrocarbon deposits. A survey typically involves deploying seismic sources and seismic sensors at predetermined locations. The sources generate seismic waves, which propagate into the geological medium creating pressure changes and vibrations. Variations in physical properties of the geological medium give rise to changes in certain properties of the seismic waves, such as their direction of propagation and other properties.

Portions of the seismic waves reach the seismic sensors. Some seismic sensors are sensitive to pressure changes (e.g., hydrophones), others to particle motion (e.g., geophones), and industrial surveys may deploy one type of sensor or both. In response to the detected seismic waves, the sensors generate corresponding electrical signals, known as traces, and record them in storage media as seismic data. Seismic data will include a plurality of "shots" (individual instances of the seismic source being activated), each of which are associated with a plurality of traces recorded at the plurality of sensors.

Seismic data can be inverted to determine reservoir properties such as impedance. Integration of seismic data into earth models of facies at the reservoir scale is most often required to make such models realistic enough to inform reservoir management decisions such as infill and injector locations, right-sizing of facilities, etc. Existing vendor, industry and academic solutions rely on calibrating seismic inversion products or other seismic attributes to well control. However, the correlation between the provided inversion products and the equivalent rock properties measured from logs along the well-path can be too low to reliably influence reservoir management decisions especially at wells that are used for cross-validation. The ability to accurately determine reservoir property values and locations is crucial to our ability to make the most appropriate choices for purchasing materials, operating safely, and successfully completing projects. Project cost is dependent upon accurate prediction of the position of physical boundaries within the Earth. Decisions include, but are not limited to, budgetary planning, obtaining mineral and lease rights, signing well commitments, permitting rig locations, designing well paths and drilling strategy, preventing subsurface integrity issues by planning proper casing and cementation strategies, and selecting and purchasing appropriate completion and production equipment.

There exists a need for an intuitive and robust measure of seismic quality. This measure must be: (1) practical—may be calculated with a wide range of available datasets, (2) robust—provide reasonable results over a wide range of settings. The seismic inversion quality property can be used to create a region in which geophysical constraints can be added to build a more deterministic reservoir property model and a region in which more statistically stochastic models must be built. Identification of the deterministic vs. stochastic regions is a key to optimizing reservoir management.

SUMMARY

In accordance with some embodiments, a method of generating reservoir property models based on seismic inversion quality is disclosed. The method includes receiving a seismic inversion product volume and a seismic attribute volume representative of a subsurface volume of interest wherein the seismic inversion product volume and the seismic attribute volume are structured as a regular grid of cells; receiving, at the computer processor, well data from wells drilled in the subsurface volume of interest; identifying collocated cells in the seismic inversion product volume by comparing the seismic inversion product volume to the well data to match an equivalent seismic inversion property derived from the well data passing through that cell; creating attribute vectors from the seismic inversion product volume and the seismic attribute volume in each of the collocated cells and a range of neighboring cells; calculating a seismic inversion error magnitude property at the collocated cells from the difference between the seismic inversion product and the equivalent seismic inversion property derived from the well data; training a data analytics method with a preprocessor to predict the observed seismic inversion error magnitude property from the attribute vectors at all cells in the grid; verifying that the data analytics method accurately predicts the seismic inversion error magnitude using cross-validation; generating an inversion quality volume using the prediction of seismic inversion error magnitude to assess inversion quality in each cell; and generating the reservoir property model based on the inversion quality volume.

In another aspect of the present invention, to address the aforementioned problems, some embodiments provide a non-transitory computer readable storage medium storing one or more programs. The one or more programs comprise instructions, which when executed by a computer system with one or more processors and memory, cause the computer system to perform any of the methods provided herein.

In yet another aspect of the present invention, to address the aforementioned problems, some embodiments provide a computer system. The computer system includes one or more processors, memory, and one or more programs. The one or more programs are stored in memory and configured to be executed by the one or more processors. The one or more programs include an operating system and instructions that when executed by the one or more processors cause the computer system to perform any of the methods provided herein.

BRIEF DESCRIPTION OF THE DRAWINGS

Like reference numerals refer to corresponding parts throughout the drawings.

DETAILED DESCRIPTION OF EMBODIMENTS

Described below are methods, systems, and computer readable storage media that provide a manner of evaluating seismic inversion results in order to build reservoir property models. These embodiments are designed to be of particular use for calculating seismic inversion error with respect to sonic well logs in order to determine seismic inversion to build reservoir property models.

Reference will now be made in detail to various embodiments, examples of which are illustrated in the accompanying drawings. In the following detailed description, numerous specific details are set forth in order to provide a thorough understanding of the present disclosure and the embodiments described herein. However, embodiments described herein may be practiced without these specific details. In other instances, well-known methods, procedures, components, and mechanical apparatus have not been described in detail so as not to unnecessarily obscure aspects of the embodiments.

The present invention includes embodiments of a method and system for generating reservoir property models based on seismic inversion products (i.e., impedance). In this invention, we compute the misfit of predicted by inversion vs. observed rock properties along well-paths by moving-window correlation. The expected misfit is interpolated between the wells throughout the volume of interest is computed using a data-science machine learning technique that is particularly appropriate for this problem (Scheevel and Payrazyan 1999). Jack-knife cross-validation is used to test the accuracy of this prediction of seismic inversion quality (high expected misfit=low inversion quality). The seismic inversion quality property can be used to create a region in which geophysical constraints can be added to build a more deterministic reservoir property model and a region in which more statistically stochastic models must be built. Identification of the deterministic vs. stochastic regions is a key to optimizing reservoir management decisions.

Figure 1:
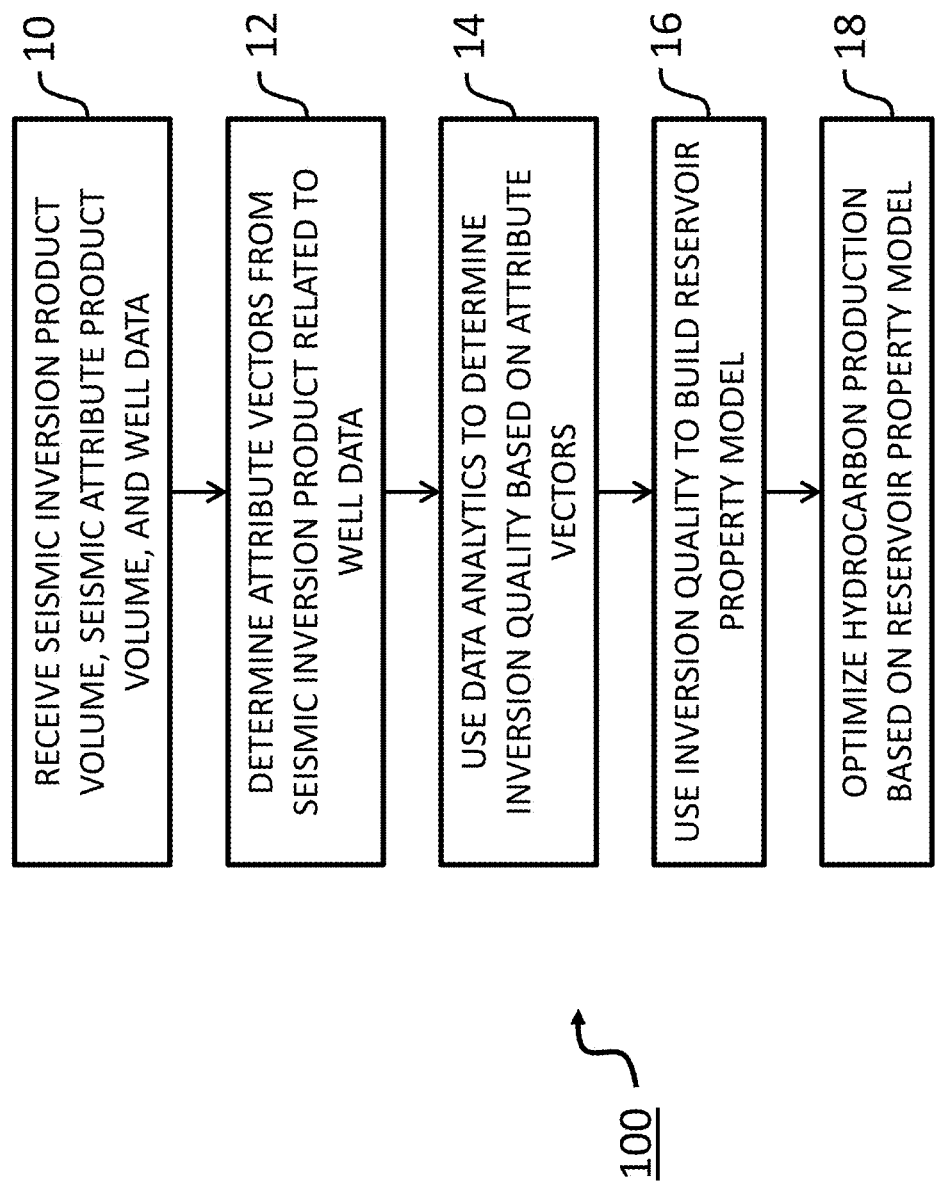
FIG. 1 illustrates a flowchart of a method of building reservoir models, in accordance with some embodiments.

FIG. 1 illustrates a flowchart of a method 100 for generating a reservoir property model. At operation 10, a seismic inversion product volume and a seismic attribute volume representative of a subsurface volume of interest are received. The seismic inversion product volume and the seismic attribute volume are structured as a regular grid of cells. Additionally, well data from wells drilled in the subsurface volume of interest is received. The well data may include, for example, well logs such as sonic logs.

At operation 12, the method determines attribute vectors from the seismic inversion product volume related to the well data. This may involve, by way of example and not limitation, identifying collocated cells in the seismic inversion product volume by comparing the seismic inversion product volume to the well data to match an equivalent seismic inversion property derived from the well data passing through that cell and creating attribute vectors from the seismic inversion product volume and the seismic attribute volume in each of the collocated cells and its neighboring cells. The equivalent seismic inversion property derived from the well data is the same property as the seismic inversion product, such as acoustic impedance (acoustic_velocity*density) which may be calculated from the sonic log and density log recorded in the well. The average collocated seismic values are found using the well-data vicinity radius. If the radius is 0, then only cells intersected by the well-path are used. If the radius is 1 then additional adjacent cells are added. If the radius is 2 then the neighbors of the adjacent cells are added. At each location in the grid, attribute vector is constructed from the collocated seismic values at the location and each of its neighbor locations (as defined by the U,V,W window size). If an additional optional property is chosen, the attribute vector has twice as many components, if three properties are chosen this gives three times as many components, etc. In this way, more than one seismic attribute and seismic inversion product can be included in the method.

At operation 14, data analytics are used to determine the inversion quality based on the attribute vectors. This may include calculating a seismic inversion error magnitude property at the collocated cells from the difference between the seismic inversion product and the equivalent seismic inversion property derived from the well data; training a data analytics method such as k-nearest neighbors with a preprocessor such as principal component analysis (PCA) to predict the observed seismic inversion error magnitude property from the attribute vectors at all cells in the grid. The PCA retains some principal components based on variance which is accomplished by partitioning the retained principal components into clusters based on characteristics in principal component space; identifying, for each cluster, data points that have known property values based on the location and the well data; and interpolating data points using an inverse distance method. The method may verify that the data analytics method accurately predicts the seismic inversion error magnitude using cross-validation such as jack-knife cross-validation. Then the method may generate an inversion quality volume using the prediction of seismic inversion error magnitude to assess inversion quality in each cell wherein a predicted high seismic inversion error magnitude indicates a low inversion quality for that cell.

At operation 16, the inversion quality is used to build the reservoir property model. In areas of good inversion quality, the seismic inversion product may be used to populate the reservoir property model. In areas of poor inversion quality, the reservoir property model is populated based on stochastic methods that do not rely on seismic data. Those of skill in the art are aware of many stochastic methods that may be used that do not require seismic data, seismic inversion products, or seismic attributes.

At operation 18, the reservoir property model is used to optimize hydrocarbon production. This may be done, for example, by selecting locations to drill wells and/or planning and performing enhanced recovery techniques such as injection for water flooding, steam flooding, and the like.

Figure 2:
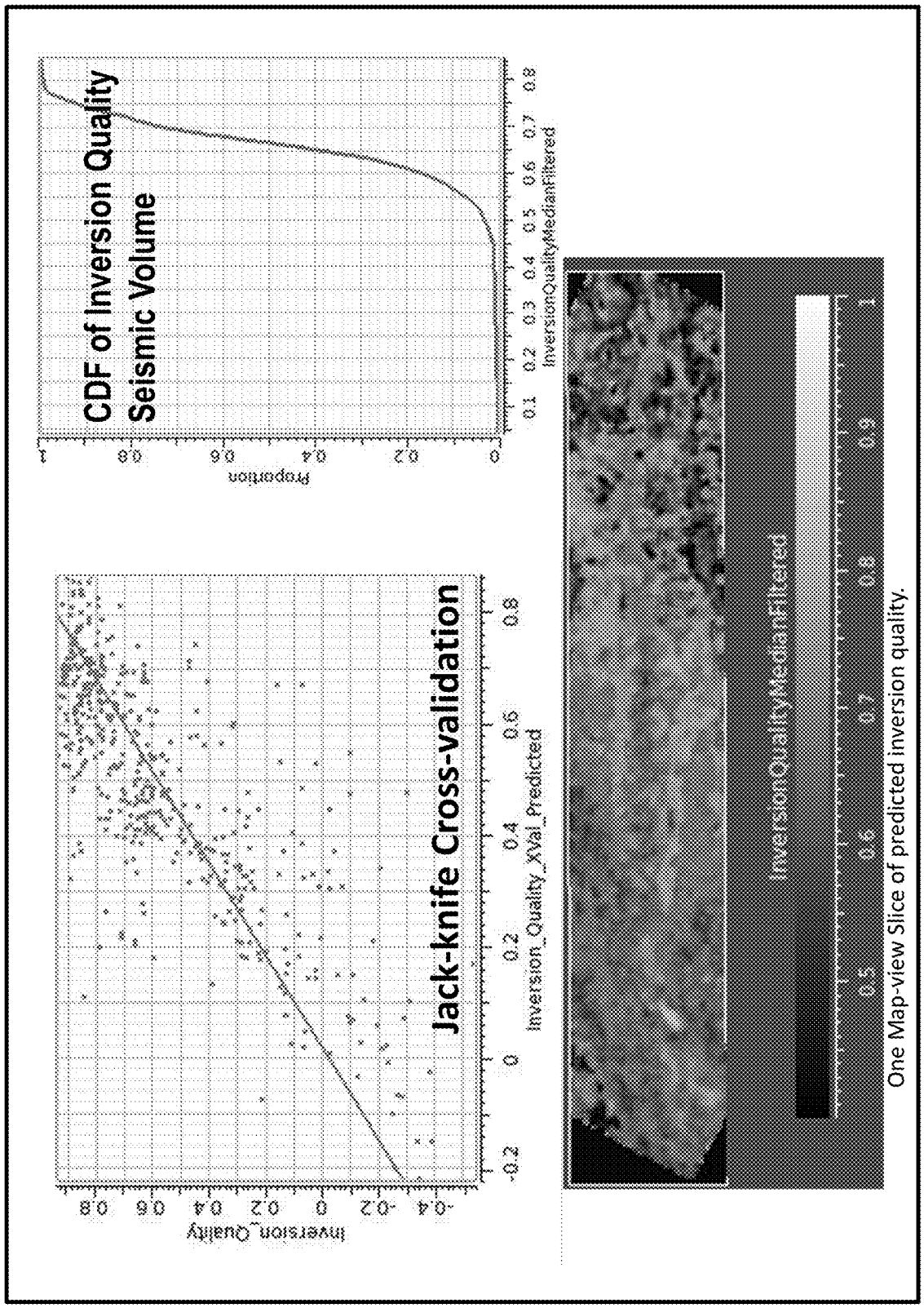
FIG. 2 is an example of steps of a method of building reservoir models, in accordance with some embodiments.
Figure 3:
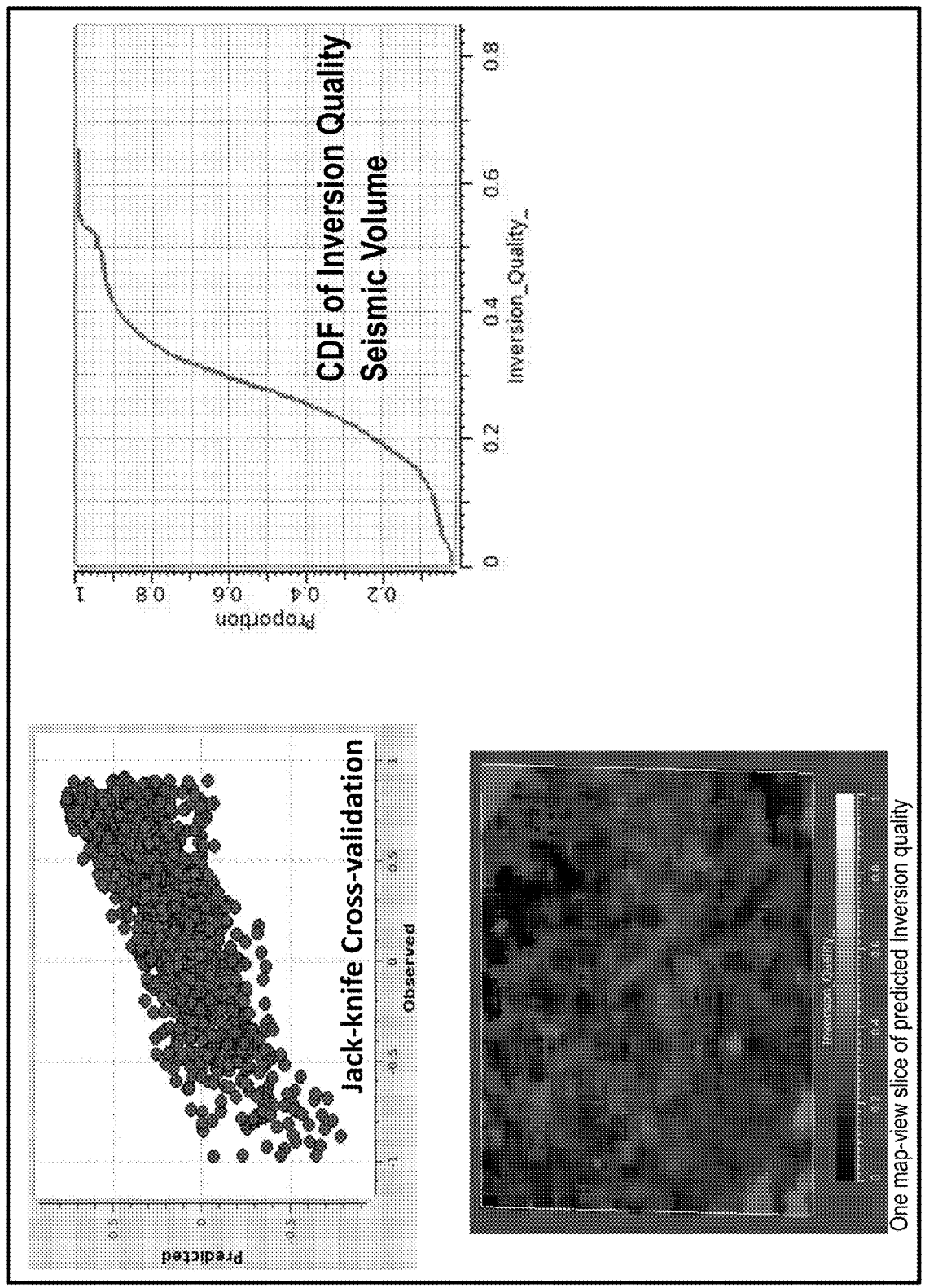
FIG. 3 is another example of steps of a method of building reservoir models, in accordance with some embodiments.

FIGS. 2 and 3 show intermediate results and a map of inversion quality as produced during the steps of method 100. In FIG. 2, method 100 is applied to generate the inversion quality volume of which a map-view slice is shown at the bottom. The inversion quality shows areal trends of around 0.8 quality, indicating that much of the seismic inversion product can be used for the reservoir model. The jack-knife cross-validation in the upper left shows a good linear correlation and the cumulative distribution function (CDF) plot of the inversion quality shown in the upper right shows the quality is high. Conversely, FIG. 3 shows the output of method 100 wherein much of the inversion quality is low. The map-view slice of the predicted inversion quality volume shows most of the quality being around 0.3 with no areal trends, meaning it is unlikely to be reliable as a reservoir model. The jack-knife cross-validation in the upper left shows a cloud of points without a good tight linear trend. The CDF plot shows the quality building up at much lower quality values than seen in FIG. 2.

Figure 4:
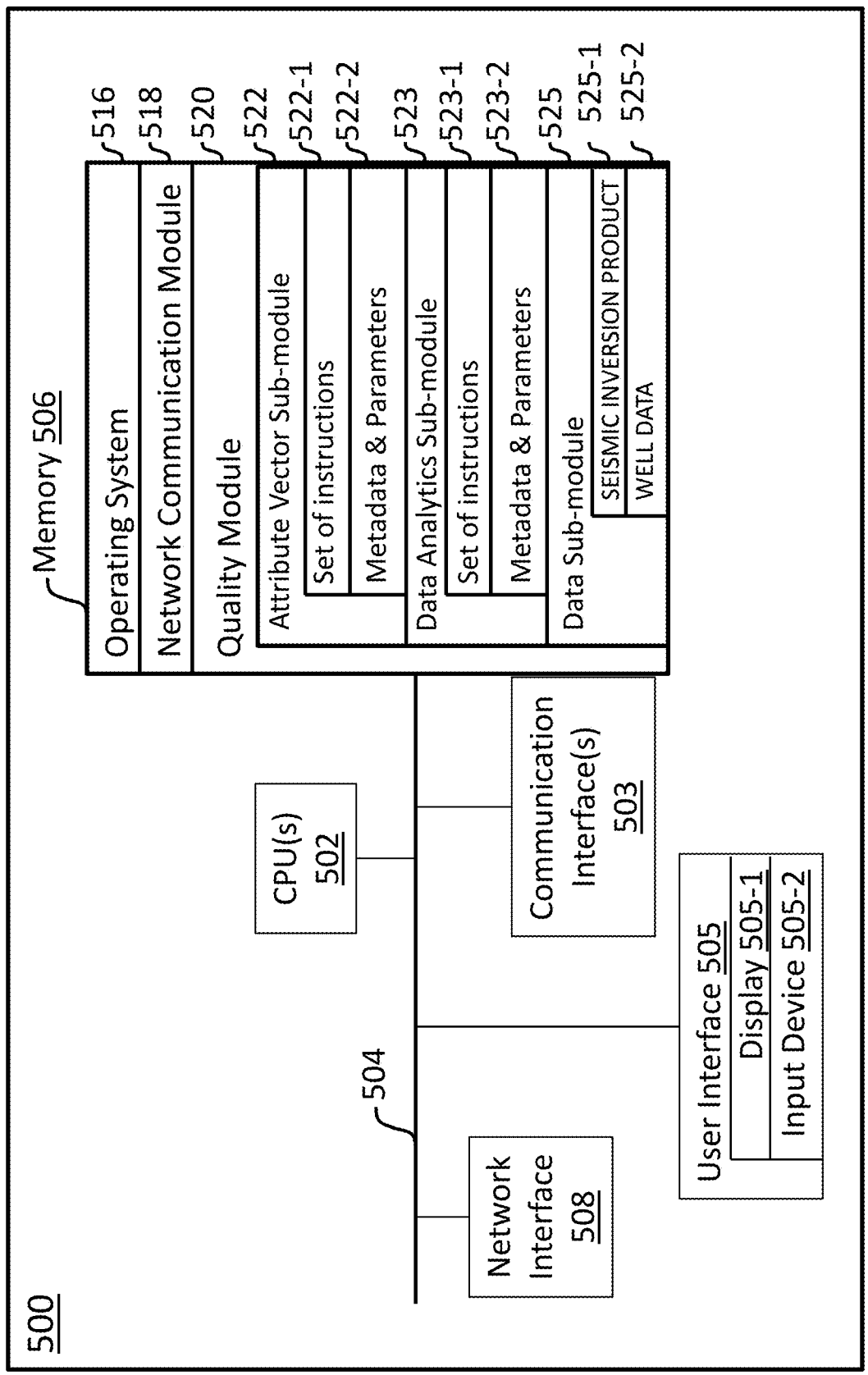
FIG. 4 is a block diagram illustrating a reservoir modeling system, in accordance with some embodiments.

FIG. 4 is a block diagram illustrating a reservoir model system 500, in accordance with some embodiments. While certain specific features are illustrated, those skilled in the art will appreciate from the present disclosure that various other features have not been illustrated for the sake of brevity and so as not to obscure more pertinent aspects of the embodiments disclosed herein.

To that end, the reservoir modeling system 500 includes one or more processing units (CPUs) 502, one or more network interfaces 508 and/or other communications interfaces 503, memory 506, and one or more communication buses 504 for interconnecting these and various other components. The reservoir modeling system 500 also includes a user interface 505 (e.g., a display 505-1 and an input device 505-2). The communication buses 504 may include circuitry (sometimes called a chipset) that interconnects and controls communications between system components. Memory 506 includes high-speed random access memory, such as DRAM, SRAM, DDR RAM or other random access solid state memory devices; and may include non-volatile memory, such as one or more magnetic disk storage devices, optical disk storage devices, flash memory devices, or other non-volatile solid state storage devices. Memory 506 may optionally include one or more storage devices remotely located from the CPUs 502. Memory 506, including the non-volatile and volatile memory devices within memory 506, comprises a non-transitory computer readable storage medium and may store seismic data, velocity models, seismic images, and/or geologic structure information.

In some embodiments, memory 506 or the non-transitory computer readable storage medium of memory 506 stores the following programs, modules and data structures, or a subset thereof including an operating system 516, a network communication module 518, and a seismic imaging module 520.

The operating system 516 includes procedures for handling various basic system services and for performing hardware dependent tasks.

The network communication module 518 facilitates communication with other devices via the communication network interfaces 508 (wired or wireless) and one or more communication networks, such as the Internet, other wide area networks, local area networks, metropolitan area networks, and so on.

In some embodiments, the quality module 520 executes the operations of method 100. Quality module 520 may include data sub-module 525, which handles the seismic dataset including seismic data 525-1 and well data 525-2. This data is supplied by data sub-module 525 to other sub-modules.

Attribute vector sub-module 522 contains a set of instructions 522-1 and accepts metadata and parameters 522-2 that will enable it to execute operation 12 of method 100. The data analytics sub-module 523 contains a set of instructions 523-1 and accepts metadata and parameters 523-2 that will enable it to contribute to operations 14 and 16 of method 100. Although specific operations have been identified for the sub-modules discussed herein, this is not meant to be limiting. Each sub-module may be configured to execute operations identified as being a part of other sub-modules, and may contain other instructions, metadata, and parameters that allow it to execute other operations of use in processing seismic data and generate the seismic image. For example, any of the sub-modules may optionally be able to generate a display that would be sent to and shown on the user interface display 505-1. In addition, any of the data or processed data products may be transmitted via the communication interface(s) 503 or the network interface 508 and may be stored in memory 506.

Method 100 is, optionally, governed by instructions that are stored in computer memory or a non-transitory computer readable storage medium (e.g., memory 506 in FIG. 4) and are executed by one or more processors (e.g., processors 502) of one or more computer systems. The computer readable storage medium may include a magnetic or optical disk storage device, solid state storage devices such as flash memory, or other non-volatile memory device or devices. The computer readable instructions stored on the computer readable storage medium may include one or more of: source code, assembly language code, object code, or another instruction format that is interpreted by one or more processors. In various embodiments, some operations in each method may be combined and/or the order of some operations may be changed from the order shown in the figures. For ease of explanation, method 100 is described as being performed by a computer system, although in some embodiments, various operations of method 100 are distributed across separate computer systems.

While particular embodiments are described above, it will be understood it is not intended to limit the invention to these particular embodiments. On the contrary, the invention includes alternatives, modifications and equivalents that are within the spirit and scope of the appended claims. Numerous specific details are set forth in order to provide a thorough understanding of the subject matter presented herein. But it will be apparent to one of ordinary skill in the art that the subject matter may be practiced without these specific details. In other instances, well-known methods, procedures, components, and circuits have not been described in detail so as not to unnecessarily obscure aspects of the embodiments.

The terminology used in the description of the invention herein is for the purpose of describing particular embodiments only and is not intended to be limiting of the invention. As used in the description of the invention and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, operations, elements, and/or components, but do not preclude the presence or addition of one or more other features, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

Although some of the various drawings illustrate a number of logical stages in a particular order, stages that are not order dependent may be reordered and other stages may be combined or broken out. While some reordering or other groupings are specifically mentioned, others will be obvious to those of ordinary skill in the art and so do not present an exhaustive list of alternatives. Moreover, it should be recognized that the stages could be implemented in hardware, firmware, software or any combination thereof.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

REFERENCES

J. R. Scheevel, and K. Payrazyan, (1999) SPE 56734, Principal Component Analysis Applied to 3D Seismic Data for Reservoir Property Estimation, pp 1-15

What is claimed is:

1. A computer-implemented method of generating a reservoir property model, comprising:
  a. receiving, at a computer processor, a seismic inversion product volume and a seismic attribute volume representative of a subsurface volume of interest wherein the seismic inversion product volume and the seismic attribute volume are structured as a regular grid of cells;
  b. receiving, at the computer processor, well data from wells drilled in the subsurface volume of interest;
  c. identifying collocated cells in the seismic inversion product volume by comparing the seismic inversion product volume to the well data to match an equivalent seismic inversion property derived from the well data passing through that cell;
  d. creating attribute vectors from the seismic inversion product volume and the seismic attribute volume in each of the collocated cells and a range of neighboring cells;
  e. calculating a seismic inversion error magnitude property at the collocated cells from the difference between the seismic inversion product and the equivalent seismic inversion property derived from the well data by calculating a correlation coefficient between an average collocated seismic inversion product and the well data at the wellbore location in a moving window whose length is sufficient to calculate correlation of desired accuracy;
  f. training a data analytics method with a preprocessor to predict the observed seismic inversion error magnitude property from the attribute vectors at all cells in the grid;
  g. verifying that the data analytics method accurately predicts the seismic inversion error magnitude using cross-validation;
  h. generating an inversion quality volume using the prediction of seismic inversion error magnitude to assess inversion quality in each cell; and
  i. generating the reservoir property model based on the inversion quality volume.

2. The method of claim 1 further comprising using the reservoir property model to optimize hydrocarbon production.

3. The method of claim 1 wherein the data analytics method is an inverse distance method in principal component analysis (PCA) space and wherein a number of principal components is retained based on an input variance percent cutoff and comprises:
  a. partitioning the retained principal components into clusters based on characteristics in principal component space;
  b. identifying, for each cluster, data points that have known property values based on the location and the well data; and
  c. interpolating data points using inverse distance weighting computed along the principal component axes.

4. The method of claim 3 wherein the partitioning the retained principal components into clusters is a K-nearest neighbor algorithm.

5. The method of claim 1 wherein the cross-validation is jack-knife cross-validation.

6. The method of claim 1 wherein generating the reservoir property model uses the inversion quality to determine regions in the reservoir property model that can be based on the seismic inversion product and wherein other regions are based on stochastic modeling without use of seismic data as a constraint.

7. A computer system, comprising:
  one or more processors;
  memory; and
  one or more programs, wherein the one or more programs are stored in the memory and configured to be executed by the one or more processors, the one or more programs including instructions that when executed by the one or more processors cause the system to:
    a. receive, at the one or more computer processors, a seismic inversion product volume and a seismic attribute volume representative of a subsurface volume of interest wherein the seismic inversion product volume and the seismic attribute volume are structured as a regular grid of cells;
    b. receive, at the one or more computer processors, well data from wells drilled in the subsurface volume of interest;
    c. identify collocated cells in the seismic inversion product volume by comparing the seismic inversion product volume to the well data to match an equivalent seismic inversion property derived from the well data passing through that cell;
    d. create attribute vectors from the seismic inversion product volume and the seismic attribute volume in each of the collocated cells and a range of neighboring cells;
    e. calculate a seismic inversion error magnitude property at the collocated cells from the difference between the seismic inversion product and the equivalent seismic inversion property derived from the well data by calculating a correlation coefficient between an average collocated seismic inversion product and the well data at the wellbore location in a moving window whose length is sufficient to calculate correlation of desired accuracy;

f. train a data analytics method with a preprocessor to predict the observed seismic inversion error magnitude property from the attribute vectors at all cells in the grid;

g. verify that the data analytics method accurately predicts the seismic inversion error magnitude using cross-validation;

h. generate an inversion quality volume using the prediction of seismic inversion error magnitude to assess inversion quality in each cell; and i. generate the reservoir property model based on the inversion quality volume.

8. A non-transitory computer readable storage medium storing one or more programs, the one or more programs comprising instructions, which when executed by an electronic device with one or more processors and memory, cause the device to a. receive, at the one or more computer processors, a seismic inversion product volume and a seismic attribute volume representative of a subsurface volume of interest wherein the seismic inversion product volume and the seismic attribute volume are structured as a regular grid of cells;

b. receive, at the one or more computer processors, well data from wells drilled in the subsurface volume of interest;

c. identify collocated cells in the seismic inversion product volume by comparing the seismic inversion product volume to the well data to match an equivalent seismic inversion property derived from the well data passing through that cell;

d. create attribute vectors from the seismic inversion product volume and the seismic attribute volume in each of the collocated cells and a range of neighboring cells;

e. calculate a seismic inversion error magnitude property at the collocated cells from the difference between the seismic inversion product and the equivalent seismic inversion property derived from the well data by calculating a correlation coefficient between an average collocated seismic inversion product and the well data at the wellbore location in a moving window whose length is sufficient to calculate correlation of desired accuracy;

f. train a data analytics method with a preprocessor to predict the observed seismic inversion error magnitude property from the attribute vectors at all cells in the grid;

g. verify that the data analytics method accurately predicts the seismic inversion error magnitude using cross-validation;

h. generate an inversion quality volume using the prediction of seismic inversion error magnitude to assess inversion quality in each cell; and generate the reservoir property model based on the inversion quality volume.

\* \* \* \* \*